United States Patent [19]

Lee

[11] Patent Number: 4,641,420
[45] Date of Patent: Feb. 10, 1987

[54] METALIZATION PROCESS FOR HEADLESS CONTACT USING DEPOSITED SMOOTHING MATERIAL

[75] Inventor: Kuo-Hua Lee, Lower Macungie Township, Lehigh County, Pa.

[73] Assignee: AT&T Bell Laboratories, Murray Hill, N.J.

[21] Appl. No.: 645,549

[22] Filed: Aug. 30, 1984

[51] Int. Cl.$^4$ .......................................... H01L 21/285
[52] U.S. Cl. .......................................... 29/511; 29/589; 29/590; 29/577 C; 148/DIG. 19; 148/DIG. 20; 148/DIG. 45
[58] Field of Search ............. 29/571, 578, 591, 577 C, 29/589, 590; 148/1.5, DIG. 43, 65, DIG. 19, DIG. 20; 357/68, 71; 156/643

[56] References Cited

U.S. PATENT DOCUMENTS

| | | | |
|---|---|---|---|
| 4,075,756 | 2/1978 | Kircher et al. | 29/847 |
| 4,234,362 | 11/1980 | Riseman | 148/187 |
| 4,291,322 | 9/1981 | Clemens et al. | 357/23 |
| 4,324,038 | 4/1982 | Chang et al. | 29/591 X |
| 4,359,816 | 11/1982 | Abbas et al. | 29/591 X |
| 4,404,733 | 9/1983 | Sasaki | 29/591 X |
| 4,419,809 | 12/1983 | Riseman et al. | 29/571 |
| 4,419,810 | 12/1983 | Riseman | 29/571 X |
| 4,489,481 | 12/1984 | Jones | 29/591 |
| 4,507,853 | 4/1985 | McDavid | 29/591 |
| 4,546,535 | 10/1985 | Shepard | 29/571 |
| 4,586,968 | 5/1986 | Coello-Vera | 148/DIG. 120 X |

FOREIGN PATENT DOCUMENTS

0036500 2/1981 European Pat. Off. .
57-72321 5/1982 Japan .

OTHER PUBLICATIONS

"Selective Reactive Ion Etching of Silicon Dioxide", *Solid State Technology*, J. S. Chang, 1984, pp. 214–219.
"Contact Resistance of LPCVD W/Al and PtSi/W/Al Metallization", *IEEE Electron Device Letters*, vol. ED-L-5, No. 6, S. Swirhun, K. C. Saraswat, and R. M. Swanson, 1984, pp. 209–211.
"Formation of Side Wall Oxide Spacers by Reactive Ion Etching in CHF$_3$ and O$_2$", *Extended Abstracts*, vol. 83-2, Abstract No. 208, T. Chernicki, K. Park, and E. Goldman, 1983, pp. 325–326.
"A Half Micron Mosfet Using Double Implanted LDD", *International Electron Devices Meeting*, Seiki Ogura et al, 1982, pp. 718–721.
"Elimination of Hot Electron Gate Current by the Lightly Doped Drain-Source Structure", International Electron Devices Meeting, Seiki Ogura et al, 1981, 651–654.
"Improvement in Sidewall Maked Isolation Process for VLSI Device Isolation", *Extended Abstracts*, vol. 83-2, Abstract No. 312, S. Swada, T. Higuchi, H. Nihira, S. Shinozaki, and O. Ozawa, 1983, pp. 492–493.
"The Swami—A Defect Free and Near-Zero Bird's-Beak Local Oxidation Process and its Application in VLSI Technology", *International Electron Devices Meeting*, K. Y. Chiu et al, 1982, pp. 224–227.
"A Bird's Beak Free Local Oxidation Technology Feasible for VLSI Circuits Fabrication", *IEEE Journal of Solid-State Circuits*, vol. SC-17, No. 2, Kuang Yi Chiu et al, 1982, pp. 166–170.

*Primary Examiner*—Brian E. Hearn
*Assistant Examiner*—Tuan Quach
*Attorney, Agent, or Firm*—James H. Fox

[57] ABSTRACT

Contacting an underlying region (e.g., doped silicon) through an access hole in an overlying dielectric layer (e.g., p-glass) formerly required flowing the dielectric to smooth the edges of the hole, so that aluminum would deposit smoothly into the hole. The present technique smoothes the side of the hole by forming a smoothing region on the sidewall. Improved aluminum coverage results, as well as allowing a smaller contact head, if desired. Improved contact resistance can be optionally provided by depositing a more conductive layer on the underlying layer prior to forming the sidewall.

37 Claims, 9 Drawing Figures

METALIZATION PROCESS FOR HEADLESS CONTACT USING DEPOSITED SMOOTHING MATERIAL

BACKGROUND OF THE INVENTION

1. Field of the Invention

The present invention relates to a technique for forming an electrical contact a conductor and an underlying region separated therefrom by a dielectric layer.

2. Description of the Prior Art

In the production of integrated circuits and other solid state devices, electrical contacts are required between an overlying conductive layer and an underlying region separated therefrom by a dielectric material. The overlying layer is typically a metal, and the underlying region is typically a doped semiconductor region, or another metal layer. Referring to FIG. 1, in one typical prior art technique, a silicon semiconductor material 10 has formed therein a doped region 11 which may be, for example, the source or drain of a field effect transistor. Formed thereon is dielectric layer 12, typically of a relatively low softening point (e.g., less than 1100° C. in the heating ambient used) glass. This dielectric layer typically has a thickness of less than 10,000 angstroms, and presently about 7,000 angstroms in one typical process. There is then formed in layer 12 an opening, also termed in the art a "window", having a width d as indicated. The etching technique utilized to form the window frequently is anisotropic; that is, tending to remove material faster in the vertical direction as viewed as compared to the horizontal direction. This process thus forms vertical sidewalls as shown. For this purpose, reactive ion etching is frequently utilized. Since it is desired to deposit a conducting material in this window, the sidewalls typically need to be smoothed. This allows a continuous conducting layer of material to be deposited. In particular, aluminum is notorious for not forming a continuous layer when deposited over vertical sidewalls.

To provide for smoothing the sidewalls, the dielectric material of region 12 is typically a phosphosilicate glass (p-glass), a borosilicate glass, or a glass containing both phosphorous and boron. A heating step, typically 900° C. to 1100° C., then causes the sidewalls to flow, forming a smooth transition region 23, as indicated in FIG. 2. Referring to FIG. 3, an aluminum layer 34 is then deposited on the smoothed dielectric material, and makes a continuous contact to the doped region 11 as indicated. Subsequent steps can be used to pattern the conducting region 34 to obtain a desired conductor pattern.

One consequence of this smoothing technique is that it increases the distance required for the top of the contact, referred to as the "head" of the contact. As shown in FIG. 3, this distance d' may be substantially greater than the distance d that initially defined the window. The increase of d' as compared to d then limits the density with which adjacent devices can be packed into a given area. Frequently, the distance d is defined by the minimum size that the lithographic technique utilized can achieve. In some cases, it is desirable to form the contact such that this minimum geometry is preserved. One technique that avoids flowing the p-glass layer is by depositing low-resistivity polysilicon into the windows prior to aluminum deposition. The polysilicon then provides electrical conductivity even if the aluminum is discontinuous; see U.S. Pat. No. 4,291,322 coassigned with the present invention. However, in some cases even lower electrical contact resistance is desired. In other cases, it is desirable to avoid forming doped (low resistivity) polysilicon, especially as in CMOS circuitry, when two different dopant types (p-type and n-type) are required In other instances, it has been found that the aluminum coverage is typically not as good as is desired, even after flowing the p-glass material. That is, small gaps or discontinuities can still exist in aluminum layer 34 deposited on flowed dielectric 12 in FIG. 3. It is desirable to have an alternate technique for making contact to an underlying layer that is separated from a conductive layer by a dielectric region.

SUMMARY OF THE INVENTION

I have invented a technique for making electrical contact to an underlying region through an overlying region of dielectric material. For illustrative purposes, the regions are referred to as "overlying" and "underlying". In this technique, an opening is formed in the overlying dielectric material, and a smoothing material is conformally deposited at least in, and typically also around, the opening. Next, an anisotropic etching process substantially removes the deposited smoothing material, except in the sidewall portion of the opening. Finally, a conducting material is deposited inside the opening. The deposited smoothing material is typically a dielectric, for example, silicon dioxide, but can alternately be a conductive material. In an alternate embodiment, a material more conductive than that of the underlying region is deposited on the underlying region prior to depositing the smoothing material. This produces a contact structure having a more conductive layer located on the underlying region in the opening of the dielectric material. The more conductive layer has located on its periphery the smoothing region, which also contacts the sidewall of the opening.

DETAILED DESCRIPTION

Figure 1:
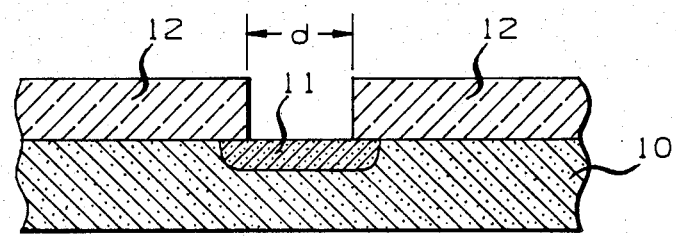
FIGS. 1–3 illustrate a prior art technique for forming aluminum contacts to semiconductor material.
Figure 2:
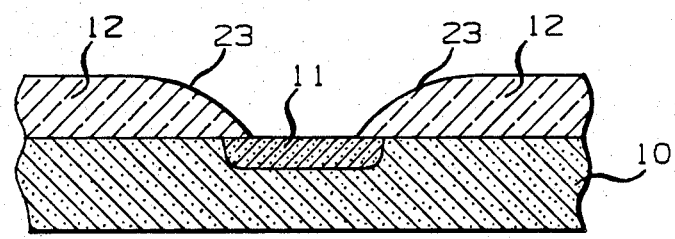
Figure 3:
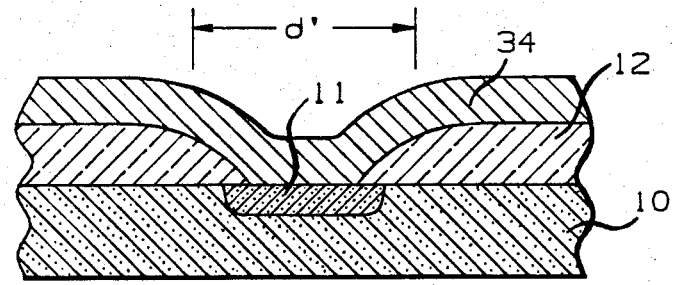
Figure 4:
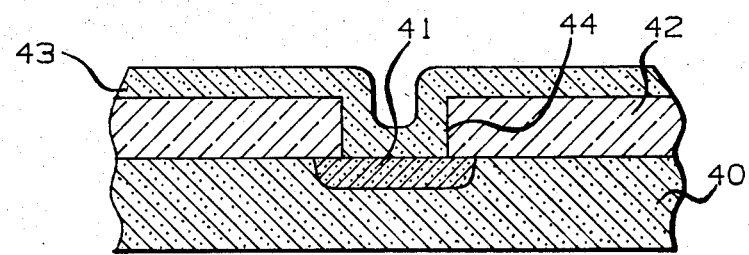
FIGS. 4–6 illustrate one embodiment of the present invention.

The following detailed description relates to an improved technique for making electrical contact to an underlying region through dielectric material. Referring to FIG. 4, it is desired to make contact to doped region 41 in semiconductor material 40. The semiconductor material is typically a silicon substrate, or epitaxial layer formed thereon. Other semiconductor materials, including group III–V materials, are possible. A dielectric material 42 is formed over the region 40. Then an opening is produced in region 42, typically by an anisotropic (i.e., one-directional) etching technique that forms approximately vertical sidewalls as indicated. In some cases, the etching process may not be entirely anisotropic, but may produce sloping sidewalls. As used herein, the term "vertical" implies that the sidewalls are within ±20 degrees of being perpendicular to the surface fo the substrate; more typically, they are within ±10 degrees of being perpendicular. The slope may be in either direction, with a negative slope indicating undercut of the dielectric region by the window. The width of the opening (d) is typically about two micrometers for current generation integrated circuits, and is expected to be less than that for future generations. If desired, the opening as formed can have a width d that is equal to the minimum lithographic dimension.

Next, a material 43, referred to herein as the "smoothing material", is conformally deposited on dielectric region 42. The conformal nature of this deposition implies that the smoothing material has approximately equal thickness over the underlying region 41, the sidewalls of the opening 44, and the surrounding dielectric material 42. In particular, note that the smoothing material 43 does not completely fill in the window, but rather follows the contours of the window. I recommend that the thickness of the smoothing material as deposited be from 0.4 to 1.5 as much as, and typically somewhat greater than one-half as much as, the thickness of the dielectric material. For example, a thickness of 4,000 angstroms for conformal smoothing material 43 is suitable for smoothing a two micrometer opening in a 7,000 angstrom thick dielectric region 42.

Figure 5:
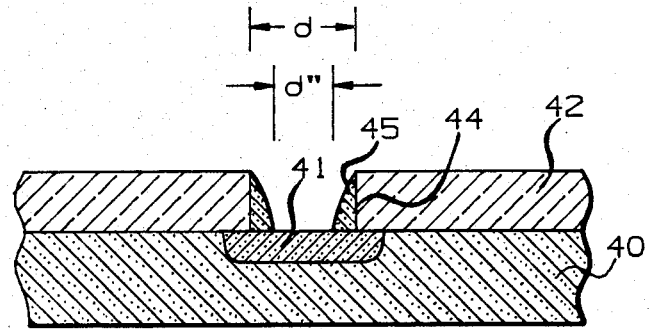
Figure 6:
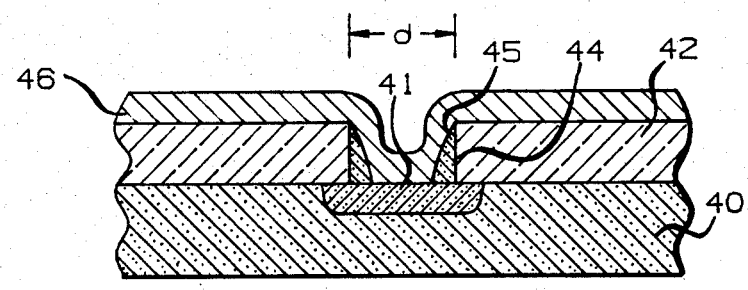

After thus depositing the smoothing material 43, it is then subjected to an anisotropic etching process, for example, a reactive ion etching process. The anisotropic etching implies that smoothing material is removed at a faster rate in the vertical direction as viewed in FIG. 4 as compared to the horizontal direction. As used herein with regard to removing the smoothing material, the term "anisotropic" means that the smoothing material is removed at least five times as fast in the vertical direction as in the horizontal direction with respect to the substrate surface. More typically, this ratio exceeds 10 to 1. The result is that the material 43 on the horizontal surfaces as viewed is substantially removed, whereas the smoothing material contacting the vertical sidewall of the window is not substantially removed. Not that the smoothing material is thus removed from the central portion of the underlying region in the opening. In addition, the top portion of the smoothing material contacting the vertical sidewall is etched to some degree. This produces the structure shown in FIG. 5, wherein smoothing region 45 adheres to the sidewall 44 of the opening in dielectric material 42. The smoothing region 45 thus has a non-vertical slope, having an angle typically greater than 20 degrees from the vertical to the substrate. This is as measured by a straight line approximation to the slope, from the upper corner to the lower inside corner of the smoothing region. This smoothing region then serves as a means for obtaining improves conductor coverage. For example, when aluminum (46) is deposited, it typically fills the opening without discontinuities, as indicated in FIG. 6. Note that the size of the contact top is now substantially defined by the distance d, which also defined the window opening. Hence, the contact is said to be "headless".

The smoothing material is typically silicon dioxide. The conformal oxide deposition can be accomplished by decomposing tetraethoxysilane, $Si(OC_2H_5)_4$, at 650° in a low pressure chemical vapor deposition (LPCVD) reaction, according to principles known in the art.

A process suitable for the anisotropic etching of the oxide material is by reactive ion etching with 90% $CHF_3 + 10\% O_2$ at 65 micrometers pressure, at 1500 watts power, or by other methods known in the art. Finally, aluminum can be deposited in the window thus smoothed by sputtering from an aluminum target at 300° C. and at $1 \times 10^{-7}$ torr pressure (e.g., in a Varian 3180 sputter system), as is also known in the art. An aluminum thickness in the range of about 0.5 to 1.0 micrometers is typically used in present processes, with a wider range being possible.

While the use of silicon dioxide as a conformally deposited smoothing material has been illustrated above, other materials are possible. For example, silicon nitride can be conformally deposited. Alternately, a conductive material can be deposited as the smoothing material. That is, a metal or metal silicide can be conformally deposited and anisotropically etched to form the smoothing region 45. The use of a conductive material has the advantage of decreasing the contact resistance between the conducting layer 46 and the underlying region 41. This is because the contact area then includes both the areas contacted by smoothing region 45 and conducting layer 46 at the surface of underlying region 41. Note that the conducting layer itself physically contacts the underlying layer only over a diameter d", as shown in FIG. 5. This diameter has the advantage that it can be less than the minimum lithographic feature size if desired, allowing high-density circuitry to be obtained. However, in some cases the relatively smaller contact area provides a larger than desired contact resistance.

In another embodiment, the conformal smoothing layer 43 is polysilicon. The polysilicon can be made conductive, either p-type or n-type, corresponding to the conductivity type of underlying region 41, by implanting the appropriate dopant species in the polysilicon material after deposition. This can be followed by a heat treatment to further distribute the dopant evenly throughout the polysilicon, and activate the dopant. Alternately, techniques are known in the art for including a dopant species in polysilicon as it is being deposited. Thus, the smoothing region may be polysilicon doped to an appropriate level for reducing the contact resistance to a doped region 41.

Figure 7:
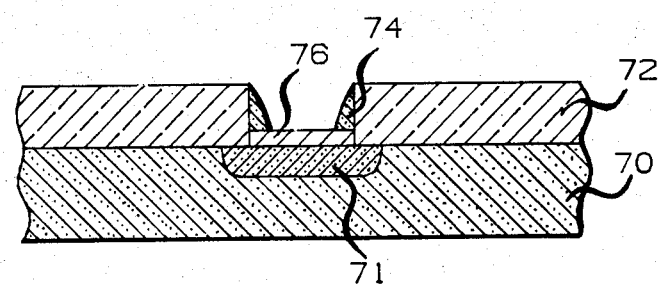
FIGS. 7–9 illustrate an alternate embodiment of the present invention.
Figure 8:
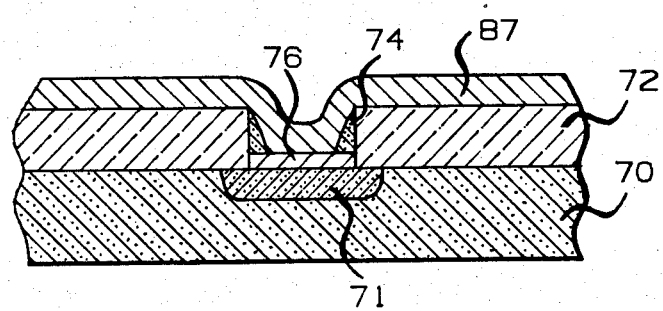
Figure 9:
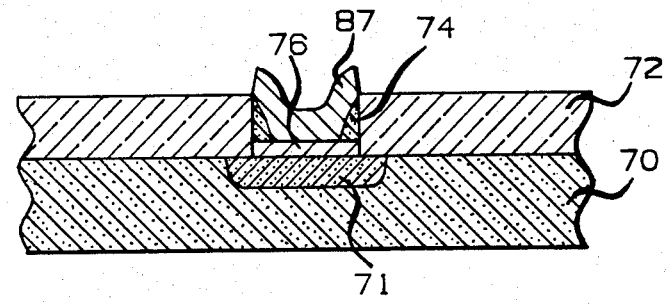

In an alternate embodiment of the present technique, it is possible to still utilize a dielectric smoothing region while also obtaining reduced contact resistance. Referring to FIG. 7, the improved contact resistance is obtained by means of a conductive layer 76 that is deposited or otherwise formed on the underlying region 71 prior to the formation of the smoothing region (74), as discussed previously. The conductive layer 76 then provides a contact area to region 71 that is substantially equal to the area of the opening as formed. The subsequent process steps than can proceed substantially as before. For example, FIG. 8 shows the conductive layer (87), which is typically aluminum, as deposited. In FIG. 9 is shown as view of the contact window, wherein the conducting layer 87 has been patterned so as to remove the aluminum in regions exterior to the window opening. With the aluminum coverage now substantially coextensive with the window opening as formed, it is apparent that the contact is now headless. Note that the aluminum coverage can continue along the direction perpendicular to the plane of FIG. 9 as viewed. The good step coverage provided by the smoothing region 74 allows the aluminum to thus connect several underlying regions (71) together. It is apparent that conducting region 87 can serve as the bit line of a dynamic random access memory, or for numerous other purposes.

The formation of the conductive layer 76 can be facilitated by a technique that provides for selective metal deposition on doped region 71 while avoiding the metal deposition on dielectric 72. Such a technique is known for tungsten; see for example, "Contact Resistance of LPCVD W/AL and PtSi/W/AL Metallization", S. Swirhun et al, *IEEE Electron Device Letters*, Vol. EDL-5, pp. 209-211 (1984). I recommend depositing the tungsten to a thickness of about 1,000 angstroms, using a non-oxidizing carrier gas (e.g., nitrogen ) to prevent the oxidation of the deposited tungstem. In an alternative method of achieving conductive layer 76, a conductive compound, for example a silicide, can be formed in situ at the surface of doped region 71. The conductive compound thus formed can include silicon derived from doped region 71. It is apparent that still other techniques are possible for selectively forming a conductive layer 76 at the bottom of the window prior to depositing the smoothing material.

One aspect of the present invention is that the dielectric material may be a flowable glass. Then, good step coverage, as over the gate of a field effect transistor, can be obtained by flowing the glass at an elevated temperature before forming the openings for the contacts of the present technique. The contact openings for the gate, source, and drain of a field effect transistor can then be formed and smoothed by the present technique. This can provide for the improved step coverage and small dimensions for contact windows formed by the present technique, while still smoothing and dielectrically isolating other features (e.g., a gate).

An additional layer can be provided between a glass layer and a semiconductor substrate. For example, a 1000 angstrom barrier layer of SiO$_2$ (not shown) can be grown or deposited on semiconductor layer (40) prior to depositing a glass layer (42). This barrier layer can then serve to prevent the migration of unwanted dopants (e.g., B or P) from the galss into the semiconductor region. Other barrier layer materials (e.g., Si$_3$N$_4$) can alternately be used. Hence, the term "overlying" does not imply that the dielectric region necessarily contacts the underlying region, although that may be the case.

While the above description has been in terms of forming a contact to a doped region in silicon, it is apparent that the technique can be applied to doped regions in other semiconductor materials; for example, gallium arsenide and other III-V materials. Furthermore, the technique can be utilized in a "double level metal" technique, wherein it is desired to make contact between an overlying metal layer and an underlying metal layer. The dielectric separating the layers may be a flowable glass, or SiO$_2$, or other material. The underlying region may be an electro-optic material, for example, lithium niobate, or a conductive pad formed thereon. Then, the conductive overlying layer that contacts the underlying region by the present technique can provide for the application of a control voltage to the electro-optic material. Still other applications are possible, as is apparent to a person of skill in the art.

What is claimed is:

1. A method of making an article including the step of making an electrical contact to an underlying doped semiconductor region by steps comprising forming an opening in an overlying dielectric material, characterized by the further steps of thereafter forming a layer of a material that is more conductive than said doped semiconductor region on said doped semiconductor region, conformally depositing a dielectric smoothing material onto the more conductive layer and the sidewall of said opening, removing the dielectric smoothing material from the central portion of the more conductive layer while maintaining a smoothing region of the dielectric smoothing material in contact with the sidewall of the opening, and depositing conducting material at least onto the central portion of the more conductive layer and onto the smoothing region.

2. The method of claim 1 wherein said smoothing material is silicon dioxide.

3. The method of claim 1 wherein said smoothing material is silicon nitride.

4. The method of claim 1 wherein said smoothing material as deposited has a thickness at least 0.4 as much as the thickness of said overlying dielectric material.

5. The method of claim 1 wherein said dielectric material is a flowable glass.

6. The method of claim 5 wherein said flowable glass is flowed at an elevated temperature so as to smooth at least one step of said article prior to said forming said opening.

7. The method of claim 1 wherein the more conductive layer substantially comprises a metal.

8. The method of claim 7 wherein said metal selectively deposits preferentially onto said doped semiconductor region as compared to onto said overlying dielectric material.

9. The method of claim 7 wherein said metal is tungsten.

10. The method of claim 1 wherein said semiconductor is silicon.

11. The method of claim 10 wherein the more conductive layer is a silicide.

12. The method of claim 11 wherein said silicide substantially comprises silicon derived from said doped semiconductor region.

13. The method of claim 1 wherein the deposited conducting material is a metal.

14. The method of claim 13 wherein said metal is aluminum.

15. The method of claim 13 wherein said depositing said metal is accomplished by sputtering.

16. A method of making an article including the step of making an electrical contact to an underlying metal layer by steps comprising forming an opening in an overlying dielectric material, characterized by the further steps of conformally depositing a dielectric smoothing material onto said underlying metal layer and the sidewall of said opening, with said smoothing material as deposited having a thickness of at least 0.4 as much as the thickness of said dielectric material, and thereafter anisotropically removing said smoothing material from the central portion of said underlying metal layer while maintaining a smoothing region of said smoothing material in contact with the sidewall of said opening, and thereafter depositing a metal layer at least onto the central portion of said underlying metal layer and onto the smoothing region.

17. The method of claim 16 wherein said smoothing material is silicon dioxide.

18. The method of claim 16 wherein said smoothing material is silicon nitride.

19. The method of claim 16 wherein said smoothing material as depsoited has a thickness of less than 1.5 of the thickness of said overlying dielectric material.

20. The method of claim 16 wherein said underlying metal layer is aluminum.

21. The method of claim 16 wherein the deposited metal layer is aluminum.

22. The method of claim 16 wherein said depositing a metal layer is accomplished by sputtering.

23. An article made by the method of claim 16.

24. A method of making an article including the step of making an electrical contact to an underlying region by steps comprising forming an opening in an overlying dielectric material,
characterized by
the further steps of thereafter forming a layer of a material that is more conductive than said underlying region on said underlying region, wherein the more conductive material substantially comprises a metal, conformally depositing a dielectric smoothing material onto the more conductive layer and the sidewall of said opening, and anisotropically removing said smoothing material from the central portion of the more conductive layer while maintaining a smoothing region of said smoothing material in contact with the sidewall of said opening, and thereafter despositing a conductor at least onto siad central portion and said smoothing region.

25. The method of claim 24 wherein said smoothing material is silicon dioxide

26. The method of claim 25 wherein said silicon dioxide is deposited by low pressure chemical vapor deposition.

27. The method of claim 24 wherein said conductor substantially comprises aluminum.

28. The method of claim 27 wherein said aluminum is deposited by sputtering.

29. The method of claim 24 wherein the thickness of said smoothing material as deposited is at least 0.4 as much as the thickness of said overlying dielectric material.

30. A method of making an article including the step of making an electrical contact to an underlying region by steps comprising forming an opening having a substantially straight sidewall in an overlying dielectric material.
characterized by
the further steps of conformally depositing a smoothing material onto said underlying region and the sidewall of said opening, anisotropically removing said smoothing material from the central portion of said underlying region while maintaining a smoothing region of said smoothing material in contact with said sidewall, and thereafter sputtering a metal at least onto the central portion of said underlying region and onto the smoothing region, wherein said underlying region is a metal silicide. region.

31. The method of claim 30 wherein said metal is aluminum.

32. The method of claim 30 wherein said metal silicide is formed on the surface of a doped semiconductor region.

33. The method of claim 30 wherein said overlying dielectric material includes a flowable glass.

34. The method of claim 33 wherein said flowable glass is flowed at an elevated temperature so as to smooth at least one step of said article prior to said forming said opening.

35. The method of claim 30 wherein said smoothing material as deposited has a thickness at least 0.4 as much as the thickness of said overlying dielectric material.

36. The method of claim 30 wherein said smoothing material is silicon dioxide

37. The method of claim 36 wherein said silicon dioxide is deposited by low pressure chemical vapor deposition.

* * * * *